US009356199B1

(12) United States Patent
Cheng et al.

(10) Patent No.: US 9,356,199 B1
(45) Date of Patent: May 31, 2016

(54) LIGHT-EMITTING DEVICE AND LIGHT-EMITTING DEVICE PACKAGE

(71) Applicant: Shenzhen China Star Optoelectronics Technology Co., Ltd., Shenzhen, Guangdong (CN)

(72) Inventors: Yan Cheng, Guangdong (CN); Gege Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/436,457

(22) PCT Filed: Jan. 14, 2015

(86) PCT No.: PCT/CN2015/070708
§ 371 (c)(1),
(2) Date: Apr. 16, 2015

(51) Int. Cl.
*H01L 33/42* (2010.01)
*H01L 33/46* (2010.01)
*H01L 33/06* (2010.01)
*H01L 33/48* (2010.01)
*H01L 33/62* (2010.01)

(52) U.S. Cl.
CPC ............... *H01L 33/46* (2013.01); *H01L 33/06* (2013.01); *H01L 33/48* (2013.01); *H01L 33/62* (2013.01)

(58) Field of Classification Search
CPC ..... H01L 33/46; H01L 33/62; H01L 29/7869; H01L 51/0085; H01L 33/48; H01L 33/68
See application file for complete search history.

(56) References Cited

U.S. PATENT DOCUMENTS

| 8,179,039 | B2 * | 5/2012 | Jeong | ..................... | H01L 33/62 313/506 |
| 8,872,205 | B2 * | 10/2014 | Yang | ..................... | H01L 33/387 257/100 |
| 2010/0171135 | A1 * | 7/2010 | Engl | ..................... | H01L 33/382 257/98 |
| 2011/0193123 | A1 * | 8/2011 | Moon | .................. | H01L 33/382 257/98 |

* cited by examiner

*Primary Examiner* — Thomas L Dickey
*Assistant Examiner* — Damon Hillman
(74) *Attorney, Agent, or Firm* — Andrew C. Cheng

(57) ABSTRACT

The invention provides a light-emitting device and a light-emitting device package. The light-emitting device includes: a light-emitting structure including a first conductive type semiconductor layer, an active layer and a second conductive type semiconductor layer sequentially stacked in that order; a first electrode disposed on a surface of the first semiconductor layer away from the active layer and electrically connected with the first semiconductor layer; a first electrode layer disposed on a surface of the second semiconductor layer away from the active layer and electrically connected with the second semiconductor layer; a second electrode penetrating through the light-emitting structure and being electrically connected with the first electrode layer; an insulating layer disposed between the light-emitting structure and the second electrode. The invention draws electrodes from the bottom of the light-emitting device, and therefore can avoid the leads to absorb and block light and thereby improve light extraction efficiency.

14 Claims, 7 Drawing Sheets

LIGHT-EMITTING DEVICE AND LIGHT-EMITTING DEVICE PACKAGE

CROSS REFERENCE TO RELATED APPLICATION

This application claims the priority of Chinese Patent Application No. 201410848993.8, entitled "Light-Emitting Device and Light-Emitting Device Package", filed on Dec. 30, 2014, the disclosure of which is incorporated herein by reference in its entirety.

BACKGROUND OF THE INVENTION

1. Field of the Invention

The invention relates to the field of light-emitting device, and particularly to a light-emitting device and a light-emitting device package.

2. Description of Related Art

Sustainable use of energy has become the focus of social attention, scientists are developing a variety of low power consumption and high performance light emitting lamps to relieve currently faced energy pressure. The light-emitting diode (referred to as LED) has prominent effects in terms of efficiency and energy saving and is becoming more popular in various fields of life.

In the prior art, a light-emitting device such as LED light-emitting chip generally leads wires from a light output surface. However, the wires/leads themselves would absorb and block light emitted from the light-emitting device, which would affect the light extraction efficiency of the light-emitting device.

SUMMARY OF THE INVENTION

Embodiments of the invention aim at a technical problem that the light-emitting chip is connected with electrodes by wires/leads which degrades the light-emitting efficiency, and therefore provide a light-emitting device and a light-emitting device package, so as to avoid the leads to absorb and block light and thereby improve light extraction efficiency of light-emitting device.

In a first aspect, an embodiment of the invention provides a light-emitting device. The light-emitting device includes: a light-emitting structure including a first conductive type semiconductor layer, an active layer and a second conductive type semiconductor layer sequentially stacked in that order, the second conductive type semiconductor layer being used as a light output surface of the light-emitting structure; a first electrode disposed on a surface of the first conductive type semiconductor layer away from the active layer and electrically connected with the first conductive type semiconductor layer; a first electrode layer disposed a surface of the second conductive type semiconductor layer away from the active layer and electrically connected with the second conductive type semiconductor layer; a second electrode penetrating through the light-emitting structure and electrically connected with the first electrode layer; and an insulating layer disposed between the light-emitting structure and the second electrode.

In conjunction with the first aspect, in a first possible implementation, the light-emitting device further includes a reflective layer; the reflective layer is disposed on a surface of the first conductive type semiconductor layer away from the active layer, the first electrode and the second electrode both penetrate through the reflective layer.

In conjunction with the first aspect, in a second possible implementation, the light-emitting device further includes a transmissive layer; the transmissive layer is disposed on a surface of the first electrode layer away from the second conductive type semiconductor layer, the transmissive layer is for increasing light extraction efficiency of the light-emitting structure.

In conjunction with the second possible implementation of the first aspect, in a third possible implementation, a surface of the transmissive layer away from the first electrode is concave and convex shaped.

In conjunction with the first aspect, in a fourth possible implementation, the light-emitting device further includes a second electrode layer; the second electrode layer is disposed on a surface of the first conductive type semiconductor layer away from the active layer, the first electrode and the first conductive type semiconductor layer are electrically connected with each other via the second electrode layer, the second electrode penetrates through the second electrode layer; the insulating layer further is disposed between the second electrode and the second electrode layer.

In conjunction with the fourth possible implementation of the first aspect, in a fifth possible implementation, the light-emitting device further includes a reflective layer; the reflective layer is disposed on a surface of the second electrode layer away from the first conductive type semiconductor layer, the first electrode and the second electrode both penetrate through the reflective layer.

In conjunction with the first aspect, in a sixth possible implementation, the light-emitting device further includes a first pad and a second pad; the first pad is disposed on a surface of the first electrode away from the first conductive type semiconductor layer and for electrically connecting with the first electrode, the second pad is disposed on a surface of the second electrode away from the first electrode layer and for electrically connecting with the second electrode.

In conjunction with the sixth possible implementation of the first aspect, in a seventh possible implementation, the light-emitting device further includes a second electrode layer; the second electrode layer is disposed on a surface of the first conductive type semiconductor layer away from the active layer, the first electrode and the first conductive type semiconductor layer are electrically connected with each other via the second electrode layer, the second pad penetrates through the second electrode layer; the insulating layer further is disposed between the second electrode and the second electrode layer as well as between the second pad and the second electrode layer.

In conjunction with the seventh possible implementation of the first aspect, in an eighth possible implementation, the light-emitting device further comprises a reflective layer; the reflective layer is disposed on a surface of the second electrode layer away from the first conductive type semiconductor layer, the first electrode or the first pad penetrates through the reflective layer, the second electrode or the second pad penetrates through the reflective layer.

In a second aspect, an embodiment of the invention provides a light-emitting device package including a light-emitting device. The light-emitting device includes: a light-emitting structure including a first conductive type semiconductor layer, an active layer and a second conductive type semiconductor layer sequentially stacked in that order, the second conductive type semiconductor layer acting as a light output surface of the light-emitting structure; a first electrode disposed on a surface of the first conductive type semiconductor layer away from the active layer and electrically connected with the first conductive type semiconductor layer; a first electrode layer disposed on a surface of the second conductive type semiconductor layer away from the active layer and is electrically connected with the second conductive type semiconductor layer; a second electrode penetrating through the light-emitting structure and being electrically connected with the first electrode layer; an insulating layer disposed between the light-emitting structure and the second electrode.

In conjunction with the second aspect, in a first possible implementation, the light-emitting device further includes a reflective layer; the reflective layer is disposed on a surface of the first conductive type semiconductor layer away from the active layer, the first electrode and the second electrode penetrate through the reflective layer.

In conjunction with the second aspect, in a second possible implementation, the light-emitting device further includes a transmissive layer; the transmissive layer is disposed on a surface of the first electrode layer away from the second conductive type semiconductor layer, the transmissive layer is for increasing light extraction efficiency of the light-emitting structure.

In conjunction with the second possible implementation of the second aspect, in a third possible implementation, a surface of the transmissive layer away from the first electrode is concave and convex shaped.

In conjunction with the second aspect, in a fourth possible implementation, the light-emitting device further includes a second electrode layer; the second electrode layer is disposed on a surface of the first conductive type semiconductor layer away from the active layer, the first electrode and the first conductive type semiconductor layer are electrically connected with each other through the second electrode layer, the second electrode penetrates through the second electrode layer; the insulating layer further is disposed between the second electrode and the second electrode layer.

In conjunction with the fourth possible implementation of the second aspect, in a fifth possible implementation, the light-emitting device further includes a reflective layer; the reflective layer is disposed on a surface of the second electrode layer away from the first conductive type semiconductor layer, the first electrode and the second electrode penetrate through the reflective layer.

In conjunction with the second aspect, in a sixth possible implementation, the light-emitting device further comprises a first pad and a second pad; the first pad is disposed on a surface of the first electrode away from the first conductive type semiconductor layer and for electrically connecting with the first electrode, the second pad is disposed on a surface of the second electrode away from the first electrode layer and for electrically connecting with the second electrode.

In conjunction with the sixth possible implementation of the second aspect, in a seventh possible implementation, the light-emitting device further includes a second electrode layer; the second electrode layer is disposed on a surface of the first conductive type semiconductor layer away from the active layer, the first electrode and the first conductive type semiconductor layer are electrically connected with each other through the second electrode layer, the second pad penetrates through the second electrode layer; the insulating layer further is disposed between the second electrode and the second electrode layer as well as between the second pad and the second electrode layer.

In conjunction with the seventh possible implementation of the second aspect, in an eighth possible implementation, the light-emitting device further includes a reflective layer; the reflective layer is disposed on a surface of the second electrode layer away from the first conductive type semiconductor layer, the first electrode or the first pad penetrates through the reflective layer, the second electrode or the second pad penetrates through the reflective layer.

By adopting the light-emitting device associated with the embodiments of the invention, the first electrode and the second electrode are protruding from the reverse surface of the light output surface of the light-emitting device, there is no need of leading wires from the light output surface of the light-emitting device, which can avoid the wires/leads connected with the first electrode and the second electrode to absorb and block light, the light extraction efficiency is improved as a result. Moreover, the light-emitting device associated with the embodiments of the invention disposes the transmissive layer on the first electrode layer, so that the emitted light would be more uniform with the aid of the transmissive layer. In addition, the upper surface of the transmissive layer can be disposed with concave-convex structures, the surface area of the transmissive layer is increased and thus the light extraction efficiency can be improved. By disposing the first electrode layer between the transmissive layer and the second conductive type semiconductor layer, the current flowing through the second electrode can uniformly spread into the second conductive type semiconductor layer via the first electrode layer; by disposing the second electrode layer between the first electrode and the first conductive type semiconductor layer, the current flowing through the first electrode can uniformly spread into the first conductive type semiconductor layer via the second electrode layer; as a result, the light-emitting performance of the light-emitting structure is improved. In addition, by disposing the reflective layer on the surface of the second electrode layer away from the first conductive type semiconductor layer, light diverged by the first conductive type semiconductor layer of the light-emitting structure can be reflected toward the light output surface of the light-emitting structure, and thus the light extraction efficiency is improved.

BRIEF DESCRIPTION OF THE DRAWINGS

In order to more clearly illustrate the technical solution of an embodiment of the invention, drawings will be used in the description of embodiments will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

It is indicated that, terminologies used in embodiments of the invention are merely for the purpose of describing particular embodiments, and not intended to limit the invention. As used in the embodiments of the invention and the appended claims, the singular forms "a", "an", "said" and "the" encompass plural forms, unless the context clearly dictates otherwise. It should also be understood that, the terminology "and/or" used herein means encompassing any or all possible combinations of one or more associated listed items. In addition, directional terms such as "upper portion", "lower portion", "top", "bottom", "upper surface" and "lower surface" in the description of the embodiments use a light output direction of the light-emitting device as a reference, for a particular part, a portion facing toward the light output direction may be referred to "upper portion", "top", "upper surface" and so on, a portion facing away from the light output direction may be referred to "lower portion", "bottom", "lower surface" and so on.

Figure 1:
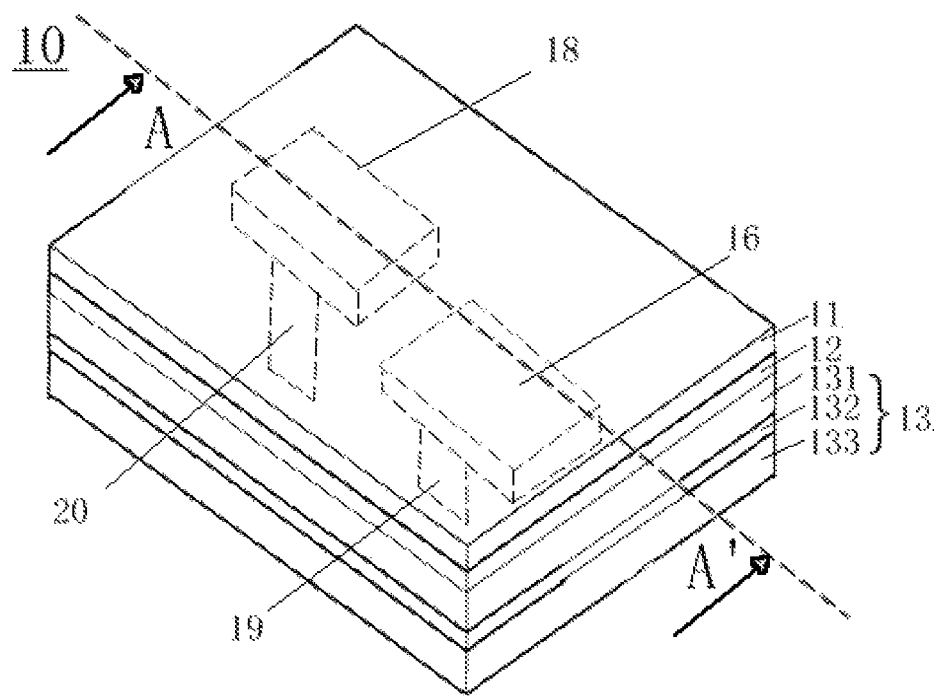
FIG. 1 is a perspective structural schematic view of a light-emitting device according to an embodiment of the invention.
Figure 2:
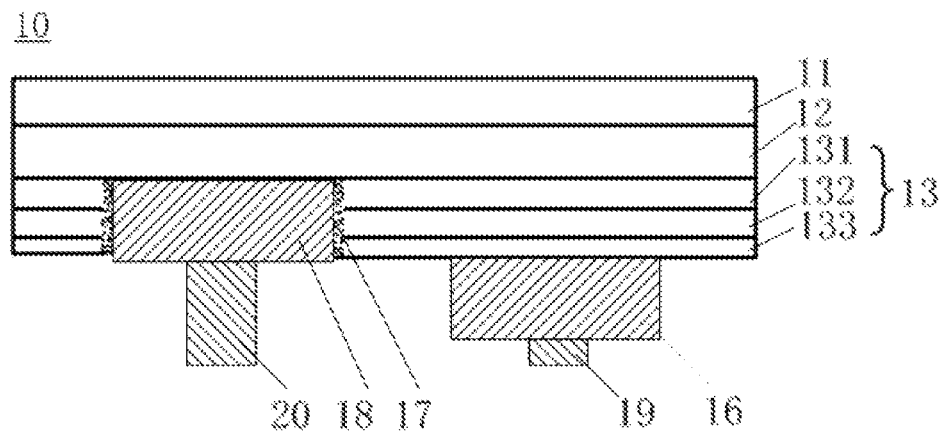
FIG. 2 is a structural schematic view of cross-section A-A' of FIG. 1 according to the embodiment of the invention.

Please refer to FIG. 1 and FIG. 2, FIG. 1 is a perspective structural schematic view of a light-emitting device according to an embodiment of the invention, and FIG. 2 is a structural schematic view of cross-section A-A' in FIG. 1 according to the embodiment of the invention. The light-emitting device 10 includes a light-emitting structure 13, a first electrode 16, a first electrode layer 12, a second electrode 18 and an insulating layer 17. The light-emitting structure 13 is configured (i.e., structured and arranged) for emitting light when being powered. The light-emitting structure 13 includes a first conductive type semiconductor layer 133, an active layer 132 and a second conductive type semiconductor layer 131 sequentially stacked in that order. The first electrode 16 is disposed on a surface of the first conductive type semiconductor layer 133 away from the active layer 132 and electrically connected with the first conductive type semiconductor layer 133 so as to transmit a current of the light-emitting structure 13. The first electrode layer 12 is disposed on a surface of the second conductive type semiconductor layer 131 away from the active layer 132 and electrically connected with the second conductive type semiconductor layer 131 so as to transmit a current for the light-emitting structure 13. The second electrode 18 penetrates through the light-emitting structure 13 and is electrically connected with the first electrode layer 12 so as to transmit a current for the light-emitting structure 13 via the first electrode layer 12. The insulating layer 17 is disposed between the light-emitting structure 13 and the second electrode 18 so as to avoid the second electrode 18 to be directly electrically connected with the light-emitting structure 13, for example, the insulating layer 17 is disposed encircling the second electrode 18.

In order to make this embodiment more perfect, the light-emitting device 10 further includes a transmissive layer 11. The transmissive layer 11 is disposed on a surface of the first electrode layer 12 away from the second conductive type semiconductor layer 131. The transmissive layer 11 is configured for increasing light extraction efficiency of the light-emitting structure 13. The transmissive layer 11 is made of a transparent material such as sapphire, resin and so on and is not limited herein. The transmissive layer 11 is used for transmitting light, and an upper surface of the transmissive layer 11 is disposed with a pattern such as concave-convex structure so as to increase the surface area of the transmissive layer and thereby improve light extraction efficiency.

The light-emitting device 10 further includes a first pad 19 and a second pad 20. The first pad 19 is disposed on a middle portion of a surface of the first electrode 16 away from the first conductive type semiconductor layer 133 and electrically connected with the first electrode 16 so as to transmit a current to the first electrode 16. The second pad 20 is disposed on a middle portion of a surface of the second electrode 18 away from the first electrode layer 12 and electrically connected with the second electrode 18 so as to transmit a current to the second electrode 18.

Concretely, a detailed description will be made to parts/elements included in the light-emitting device 10 according to its structural sequence. In addition, for the convenience of description, the light output direction temporarily is set as upward direction, apparently, when the reference object is changed, directional terminologies in this embodiment should be changed correspondingly.

The first electrode layer 12 is disposed on the lower surface of the transmissive layer 11. The first electrode layer 12 is an electrically conductive material, and the electrically conductive material has a light transmitting property, such as Au (gold), Al (aluminum), Pd (palladium) or Rh (rhodium), a film it formed not only is electrically conductive but also light transmissive, the invention does not impose any limitation to its material.

The light-emitting structure 13 is disposed on a surface of the first electrode layer 12 away from the transmissive layer 11, i.e., the lower surface of the first electrode layer 12. The light-emitting structure 13 includes the first conductive type semiconductor layer 133, the active layer 132 and the second conductive type semiconductor layer 131. The active layer 132 is disposed on the first conductive type semiconductor layer 133, the second conductive type semiconductor layer 131 is disposed on the active layer 132; the first conductive type semiconductor layer 133, the active layer 132 and the second conductive type semiconductor layer 131 are electrically connected with one another together to form an element capable of emitting light, after the element is connected with electrodes with opposite polarities respectively at the upper and lower surfaces, it can be powered to emit light.

The first conductive type semiconductor layer 133 includes at least one semiconductor layer doped with a first type ion, when the first conductive type semiconductor layer 133 is an N-type semiconductor layer, the first conductive type semiconductor layer may include at least one of GaN, InN, AlN, InGaN, AlGaN, InAlGaN, AlInN, AlGaAs, GaP, GaAs, GaAs and AlGaInP. When the first type ion is an N-type ion, the first conductive type semiconductor layer 133 may include Si, Ge, Sn, Se or Te.

The active layer 132 may include an III-V Group compound semiconductor(s). The active layer 132 may include at least one of a single quantum well structure, a multiple quantum well structure, a quantum wire structure and a quantum dot structure. Well layer/barrier layer of the active layer 132 may include paired structures of InGaN/GaN, GaN/AlGaN or InGaN/InGaN, but the embodiment is not limited thereto. The active layer 132 is made of a material having a band gap depending on a wavelength of emitted light. For example, in the case of blue light with a wavelength of 460~470 nm, the active layer 132 has a single quantum well structure or a multiple quantum well structure including InGaN well layer/GaN barrier layer. The active layer 132 may selectively include a material capable of providing a light of visible ray frequency band such as blue light, red light or green light, and the material may be varied within the technical scope of the embodiment.

The second conductive type semiconductor layer 131 includes at least one semiconductor layer doped with a second type ion. When the second conductive type semiconductor layer 131 is a P-type semiconductor layer, the second conductive type semiconductor layer 131 may include at least one of GaN, InN, AlN, InGaN, AlGaN, InAlGaN, AlInN, AlGaAs, GaP, GaAs, GaAsP and AlGaInP. When the second type ion is a P-type ion, the second conductive type semiconductor layer 131 may include at least one of Mg, Zn, Ca, Sr and Ba.

Concretely, the upper surface of the second conductive type semiconductor layer 131 in the light-emitting structure 13 is contacted with the lower surface of the first electrode layer 12, and therefore the second conductive type semiconductor layer 131 and the first electrode layer 12 can uniformly and stably diffuse/spread a current therebetween 12.

The first electrode 16 is electrically connected with the light-emitting structure 13. In particular, the first electrode 16 is contacted with the surface of the first conductive type semiconductor layer 133 in the light-emitting structure 13 away from the active layer 132, to make the current more uniformly transmit between the first electrode 16 and the first conductive type semiconductor layer 133. A concrete contacted portion of the lower surface of the first conductive type semiconductor layer 133 with the first electrode 16 is not limited herein.

The second electrode 18 is contacted with the first electrode layer 12. In particular, the second electrode 18 penetrates through the light-emitting structure 13, and is contacted with the surface of the first electrode layer 12 away from the transmissive layer 11 to form an electrical connection, so as to use the first electrode layer 12 to diffuse the current into the second conductive type semiconductor layer 131. It is noted that, the second electrode 18 although penetrates through the light-emitting structure 13, it is not electrically contacted with the light-emitting structure 13. Concretely, an insulating layer 17 is disposed between the second electrode 18 and the light-emitting structure 13, so that the second electrode 18 is not directly connected with the light-emitting structure 13 but indirectly connects with the second conductive type semiconductor layer 131 of the light-emitting structure 13 via the second electrode layer 12 to thereby achieve the current transfer.

A material used by the insulating layer 17 includes but is not limited to an organic solid insulating material such as insulating paint, insulating paste, insulating paper, insulating fiber product, plastic, rubber, linoleum paint tubes and insulation impregnated fiber product, thin film for electrical purposes, composite product and adhesive tape, laminates for electrical purposes; or an inorganic solid insulating material mainly is mica, glass, ceramic or product thereof, and so on.

Furthermore, a material of the first electrode 16 and the second electrode 18 may be at least one of Ti, Al, In, Ta, Pd, Co, Ni, Si, Ge, Ag, Rh, Au, Ir, Pt, W and Au, or a mixture thereof, this embodiment does not limit the material. In addition, a top view structure of each of the first electrode 16 and the second electrode 18 includes but is not limited to a linear pattern, meander pattern, a mixture pattern of linear pattern and meander pattern, plural patterns branching from one pattern, a polygonal pattern, a grid shape pattern, a dot shape pattern, a diamond pattern, a parallelogram pattern, a mesh shape pattern, a stripe pattern, a cross pattern, a star pattern, a circular pattern, or a mixture pattern thereof, but this embodiment is not limited thereto. The first electrode 16 with a pattern can uniformly supply power to the first conductive type semiconductor layer 133 to thereby prevent current from being concentrated at one site; the second electrode 18 with a pattern can uniformly supply power to the second conductive type semiconductor layer 131 to thereby prevent current from being concentrated at one site.

Still further, the lower portion of the first electrode 16 may be formed with a first pad 19 to smoothly transmit power, the lower portion of the second electrode 18 may be connected to a second pad 20 to smoothly transmit power. The first pad 19 and the second pad 20 each may be made of a material containing Ti, Al, In, Ta, Pd, Co, Ni, Si, Ge, Ag, Rh, Au, Ir, Pt, W or Au, and this embodiment does not limit the material herein.

Based on the above described structure, by connecting the first pad 19 to a positive electrode of a power supply, the first pad 19 can obtain a current coming from the power supply and then transmit the current to the first electrode 16 connected therewith; the first electrode 16 diffuses the current to the first conductive type semiconductor layer 133 in the light-emitting structure 13 and electrically connected therewith. Moreover, the second conductive type semiconductor layer 131 of the light-emitting structure 13 smoothly transmit the current to the first electrode layer 12 connected therewith, and the first electrode layer 12 then transmits the current to the second electrode 18, the current further flows to the second pad 20 and finally goes back to a negative electrode of the power supply via the second pad 20. Thus, a closed circuit of current is formed, the first conductive type semiconductor layer 133 of the light-emitting structure 13 has a current flowing in, and the second conductive type semiconductor layer 131 has a current flowing out, as a result, light is emitted. It is noted that, which one of the first electrode 16 and the second electrode 18 concretely is connected to which one of the positive and negative electrodes of power supply, which is determined by the structure of the light-emitting structure 13; and the connections of the first electrode 16 and the second electrode 18 with corresponding electrodes of power supply are not limited herein.

Compared with the prior art, by adopting the light-emitting device 10 as illustrated in FIGS. 1 and 2, the first electrode 16 and the second electrode 18 protrude from the reverse surface of the light output surface of the light-emitting device 10, there is no need of leading wires from the light output surface of the light-emitting device 10, which can avoid the wires/leads connected with the first electrode 16 and the second electrode 18 to absorb and block light, the light extraction efficiency is increased consequently. Furthermore, the light-emitting device 10 of this embodiment of the invention disposes a transmissive layer 11 on the first electrode layer 12, so that the emitted light would be more uniform with the aid of the transmissive layer 11. In addition, the upper surface of the transmissive layer 11 may be disposed with a concave-convex structure to increase the surface area of the transmissive layer 11 and thereby increase the light extraction efficiency.

Figure 3:
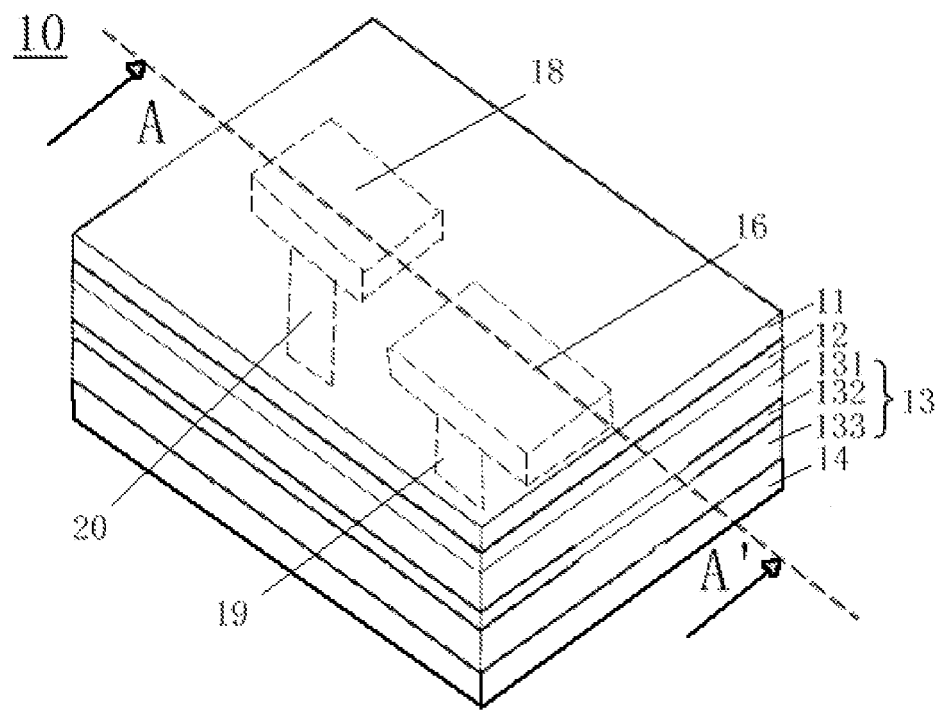
FIG. 3 is a perspective structural schematic view of another light-emitting device according to an embodiment of the invention.
Figure 4:
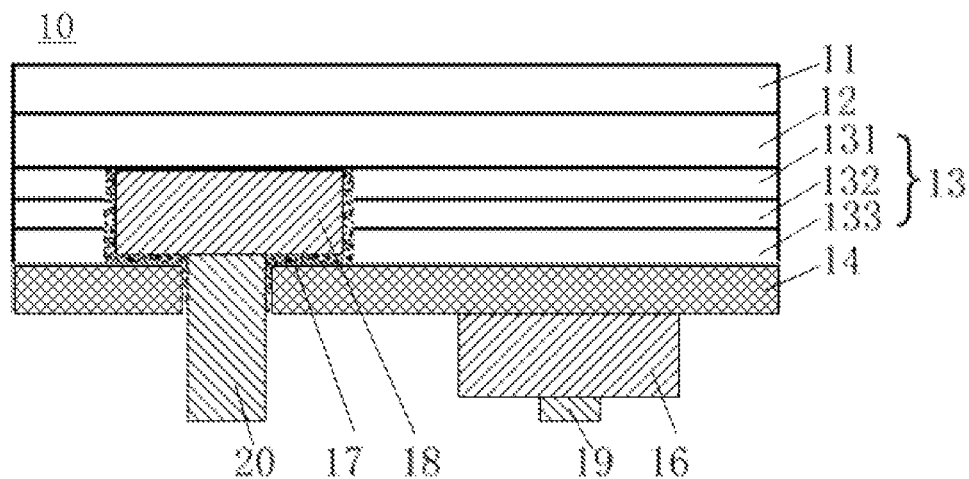
FIG. 4 is a structural schematic view of cross-section A-A' of FIG. 3 according to the embodiment of the invention.

Please refer to FIG. 3 and FIG. 4. FIG. 3 is a perspective structural schematic view of a light-emitting device according to another embodiment of the invention, and FIG. 4 is a structural schematic view of cross-section A-A' in FIG. 3 according to the embodiment of the invention. The light-emitting device 10 as illustrated in FIGS. 3 and 4 besides includes the light-emitting structure 13, the first electrode 16, the first electrode layer 12, the second electrode 18, the insulating layer 17, the transmissive layer 11, the first pad 19 and the second pad 20 also in the light-emitting device 10 as illustrated in FIG. 2, but also includes a second electrode layer 14. The second electrode layer 14 is disposed on a surface of the first conductive type semiconductor layer 133 away from the active layer, the first electrode 16 is connected to the first conductive type semiconductor layer 133 via the second electrode layer 14 to uniformly transmit a current to the first conductive type semiconductor layer 133, so as to avoid current concentration during transfer. The second electrode layer 14 covers the entire lower surface of the first conductive type semiconductor layer 133. Moreover, the second electrode layer 14 is disposed with a through hole, the second pad 20 electrically connected with the second electrode 16 protrudes out of the through hole to connect an external lead. In addition, the insulating layer 17 is disposed between the second electrode layer 14 and the second pad 20 to avoid short-circuit of the whole light-emitting device 10 resulting from the second electrode layer 14 being electrically connected with the second pad 20, for example, the insulating layer 17 is disposed surrounding the second pad 20 as well as the second electrode 18. It is noted that, a material used by the second electrode layer 14 includes but is not limited to Ag, Ni, Al, Rh, Pd, Ir, Ru, Mg, Zn, Pt, Au or Hf.

Compared with the prior art, by adopting the light-emitting device 10 as illustrated in FIGS. 3 and 4, the first electrode 16 and the second electrode 18 are protruding from the reverse surface of the light output surface of the light-emitting device 10, there is no need of leading wires from the light output surface of the light-emitting device 10, which can avoid the wires/leads connected with the first electrode 16 and the second electrode 18 to absorb and block light, the light extraction efficiency is improved as a result. Moreover, the light-emitting device 10 associated with this embodiment of the invention disposes the transmissive layer 11 on the first electrode layer 12, so that the emitted light would be more uniform with the aid of the transmissive layer 11. In addition, the upper surface of the transmissive layer 11 can be disposed with concave-convex structure (i.e., generally is concave and convex shaped), the surface area of the transmissive layer 11 is increased and thus the light extraction efficiency can be improved. By disposing the first electrode layer 12 between the transmissive layer 11 and the second conductive type semiconductor layer 131, the current flowing through the second electrode 18 can uniformly spread into the second conductive type semiconductor layer 131 via the first electrode layer 12; by disposing the second electrode layer 14 between the first electrode 16 and the first conductive type semiconductor layer 133, the current flowing through the first electrode 16 can uniformly spread into the first conductive type semiconductor layer 133 via the second electrode layer 14; as a result, the light-emitting performance of the light-emitting structure 13 is improved.

Figure 5:
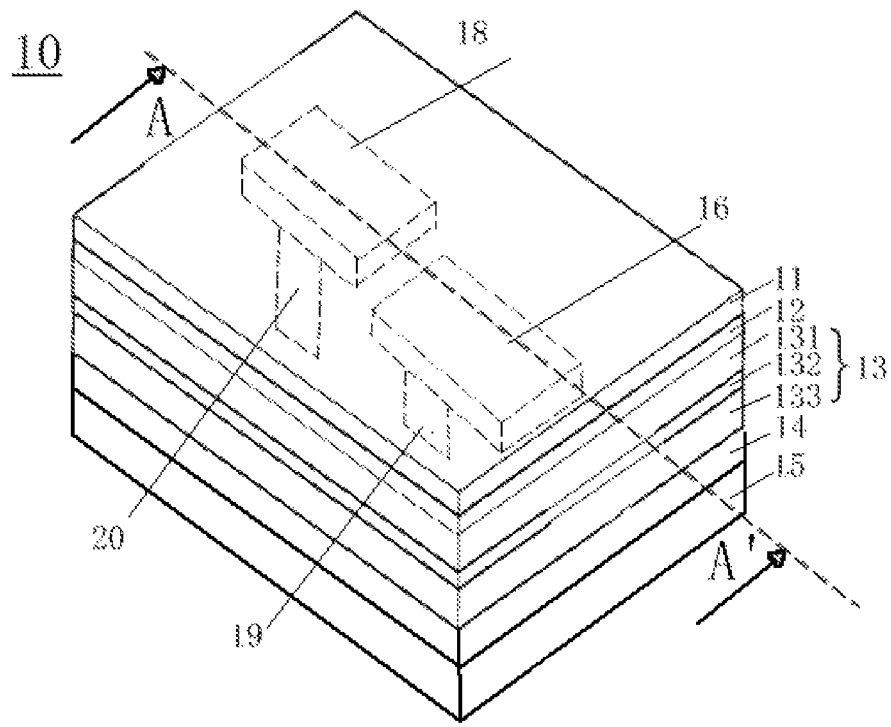
FIG. 5 is a perspective structural schematic view of still another light-emitting device according to an embodiment of the invention.
Figure 6:
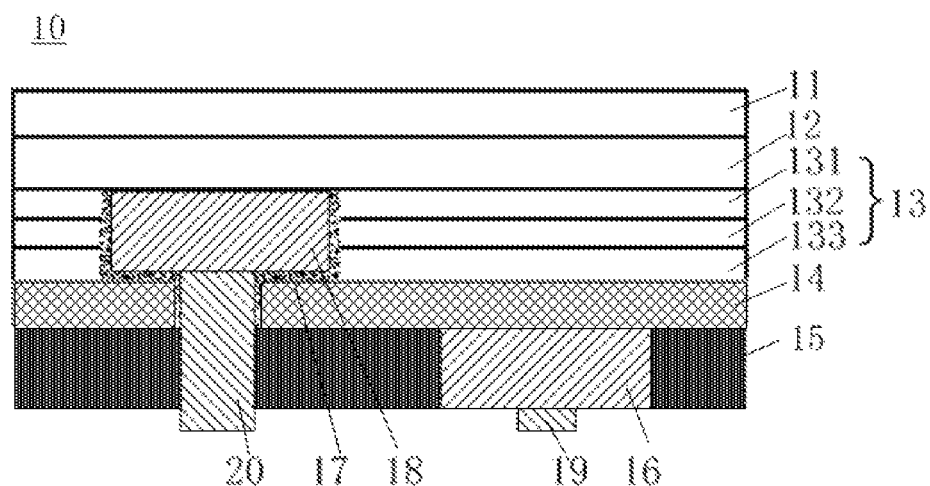
FIG. 6 is a structural schematic view of cross-section A-A' of FIG. 5 according to the embodiment of the invention.

Please refer to FIG. 5 and FIG. 6, FIG. 5 is a perspective structural schematic view of a light-emitting device according to still another embodiment of the invention, and FIG. 6 is a structural schematic view of cross-section A-A' in FIG. 5 according to the embodiment of the invention. The light-emitting device 10 as illustrated in FIGS. 5 and 6 besides includes the light-emitting structure 13, the first electrode 16, the first electrode layer 12, the second electrode 18, the insulating layer 17, the transmissive layer 11, the first pad 19, the second pad 20 and the second electrode layer 14 also in the light-emitting device 10 as illustrated in FIG. 4, but also includes a reflective layer 15. The reflective layer 15 is disposed on the exposed entire surface of the second electrode layer 14 away from the first conductive type semiconductor layer 133 and is for reflecting light diverged by the first conductive type semiconductor layer 133 of the light-emitting structure 133, so as to increase the light extraction efficiency of the light-emitting device 10.

Furthermore, the reflective layer 15 is disposed with two through holes. The first electrode 16 or the first pad 19 protrudes out from one of the through holes to connect an external wire/lead, and the second pad 20 protrudes out from the other one of the through holes to connect an external wire/lead.

It is noted that, the reflective layer 15 may be a metal material such as Al or Ag. When the reflective layer 15 is a metal material, the reflective layer 15 and the second pad 20 necessarily are disposed with the insulating layer 17 therebetween. The reflective layer 15 also may be a polymer material such as PVC or PU. The embodiment of the invention does not limit the material of the reflective layer 15, but this embodiment preferably uses an insulating polymer material as the source of material of the reflective layer 15, which not only can play the role of reflection but also can achieve the external insulation, and therefore the safety is increased.

Compared with the prior art, by adopting the light-emitting device 10 as illustrated in FIGS. 5 and 6, the first electrode 16 and the second electrode 18 are protruding from the reverse surface of the light output surface of the light-emitting device 10, there is no need of leading wires from the light output surface of the light-emitting device 10, which can avoid the wires/leads connected with the first electrode 16 and the second electrode 18 to absorb and block light, the light extraction efficiency is improved as a result. Moreover, the light-emitting device 10 associated with this embodiment of the invention disposes the transmissive layer 11 on the first electrode layer 12, so that the emitted light would be more uniform with the aid of the transmissive layer 11. In addition, the upper surface of the transmissive layer 11 can be disposed with concave-convex structures, the surface area of the transmissive layer 11 is increased and thus the light extraction efficiency can be improved. By disposing the first electrode layer between the transmissive layer 11 and the second conductive type semiconductor layer 131, the current flowing through the second electrode 18 can uniformly spread into the second conductive type semiconductor layer 131 via the first electrode layer 12; by disposing the second electrode layer 14 between the first electrode 16 and the first conductive type semiconductor layer 133, the current flowing through the first electrode 16 can uniformly spread into the first conductive type semiconductor layer 133 via the second electrode layer 14; as a result, the light-emitting performance of the light-emitting structure 13 is improved. By disposing the reflective layer 15 on the surface of the second electrode layer 14 away from the first conductive type semiconductor layer 133, light diverged by the first conductive type semiconductor layer 133 of the light-emitting structure 13 can be reflected toward the light output surface of the light-emitting structure 13, and the light extraction efficiency is improved.

FIGS. 7-17 are process flow diagrams of a light-emitting device according to an embodiment of the invention. The process is used for manufacturing the light-emitting device 10 as illustrated in FIGS. 5 and 6.

Figure 7:
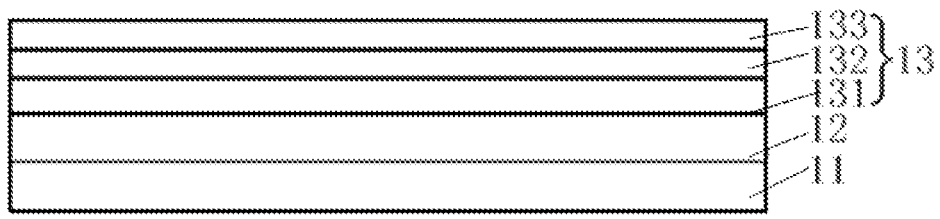
FIGS. 7-17 are process flow diagrams of a light-emitting device according to an embodiment of the invention.

In FIG. 7, a first electrode layer 12 is formed on a transmissive layer 11. The first electrode layer 12 may be a film formed by for example Au or Al, and thus it is light transmissive and has electrically conductive property.

A light-emitting structure 13 is formed on the first electrode layer 12. The light-emitting structure 13 includes a first conductive type semiconductor layer 133, an active layer 132 and a second conductive type semiconductor layer 131 sequentially stacked in that order.

The active layer 132 is formed on the first conductive type semiconductor layer 133. The active layer 132 may include an III-V Group compound semiconductor(s). The active layer 132 may include at least one of a single quantum well structure, a multiple quantum well structure, a quantum wire structure and a quantum dot structure. Well layer/barrier layer of the active layer 132 may include paired structures of InGaN/GaN, GaN/AlGaN, or InGaN/InGaN, but this embodiment is not limited thereto.

A first electrically conductive cladding layer can be provided at the bottom of the active layer 132, and a second electrically conductive cladding layer can be provided at the top of the active layer 132. The first and second electrically conductive cladding layers may include a GaN-based semiconductor, and a band gap thereof is higher than a band gap of the active layer 132.

The active layer 132 can include a material can emit a colored light such as blue light, red light or green light, and the material may be varied within the technical scope of the embodiment.

The second conductive type semiconductor layer 131 is formed on the active layer 132. The second conductive type semiconductor layer 131 includes at least one semiconductor layer doped with a second type ion and a second electrode contact layer. When the second conductive type semiconductor layer 131 is a P-type semiconductor layer, the second conductive type semiconductor layer 131 may include at least one of GaN, InN, AlN, InGaN, AlGaN, InAlGaN, AlInN, AlGaAs, GaP, GaAs, GaAsP and AlGaInP. When the second type ion is a P-type ion, the second conductive type semiconductor layer 131 may include at least one of Mg, Zn, Ca, Sr and Ba.

Figure 8:
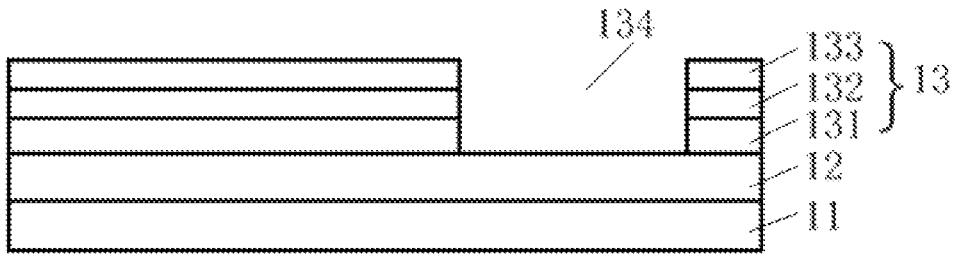

In FIG. 8, a first groove 134 is formed in the light-emitting structure 13 by an etching process. The first groove 134 is a penetration cavity of the light-emitting structure 13, to expose the first electrode layer 12 electrically connected with the light-emitting structure 13.

Figure 9:
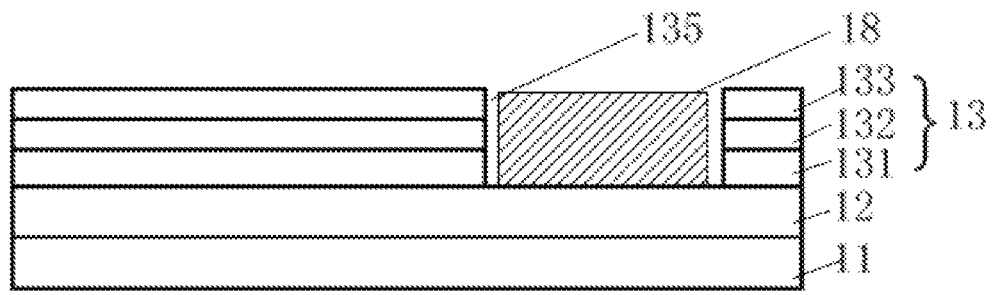

In FIG. 9, the first groove 134 is for securing a second electrode 18 therein, for facilitating the second electrode 18 to electrically connect with the first electrode layer 12. A first gap 135 is formed between the light-emitting structure 13 and the second electrode 18.

Figure 10:
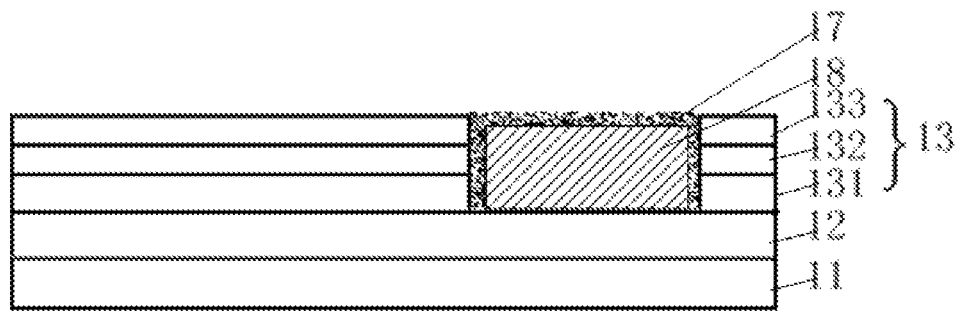

In FIG. 10, the first gap 135 is filled with an insulating layer 17 to secure the second electrode 18 in the light-emitting structure 13, so that the second electrode 18 can be insulated from the light-emitting structure 13 and simultaneously electrically connected with the first electrode layer 12. A material used by the insulating layer 17 includes but is not limited to an organic solid insulating material such as insulating paint, insulating paste, insulating paper, insulating fiber product, plastic, rubber, linoleum paint tubes and insulation impregnated fiber product, thin film for electrical purposes, composite product and adhesive tape, laminates for electrical purposes; or an inorganic solid insulating material mainly is mica, glass, ceramic or product thereof, and so on. This embodiment does not limit the material used by the insulating layer 17.

Figure 11:
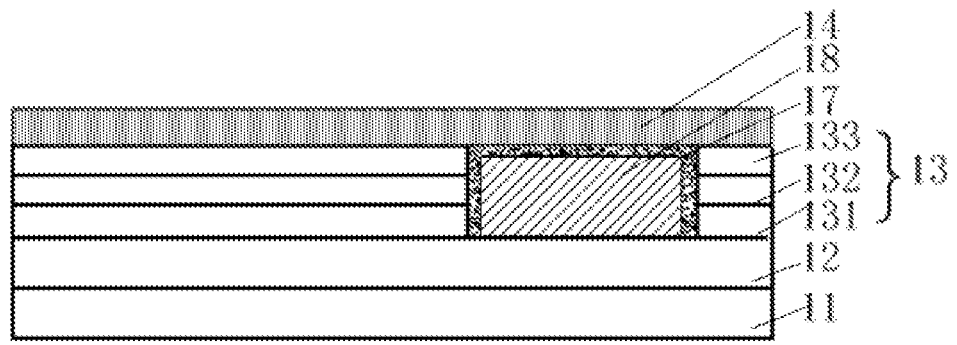

In FIG. 11, the light-emitting structure 13 and the insulating layer 17 are coated with a second electrode layer 14 thereon. A material used by the second electrode layer 14 includes but is not limited to Ag, Ni, Al, Rh, Pd, Ir, Ru, Mg, Zn, Pt, Au or Hf.

Figure 12:
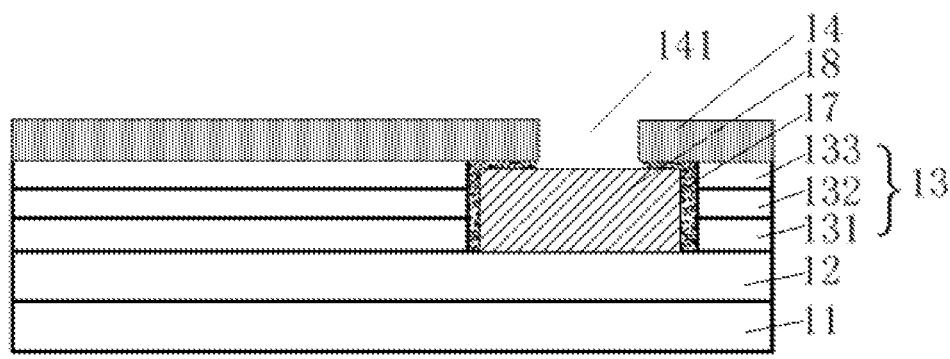

In FIG. 12, a second groove 141 is formed in the second electrode layer 14 by an etching process. The second groove 141 penetrates through the second electrode layer 14 and the insulating layer 17 contacted with the second electrode layer 14, to expose the second electrode 18.

Figure 13:
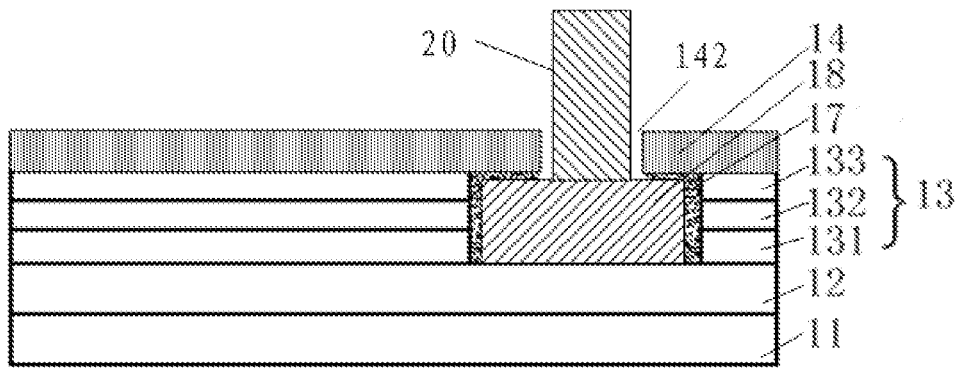

In FIG. 13, a second pad 20 is disposed in the second groove 141. One end of the second pad 20 is electrically connected with the exposed second electrode 18, and the other end of the second pad 20 protrudes out of the surface of the second electrode layer 14. The second pad 20 and the first electrode layer 14 form a second gap 142 therebetween.

Figure 14:
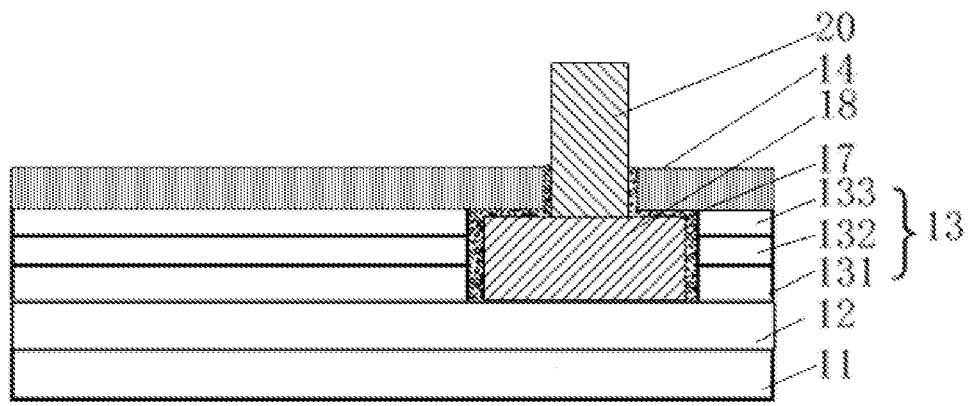

In FIG. 14, in the second gap 142, i.e., between the second pad 20 and the second electrode layer 14 is formed with the insulating layer 17 to avoid short-circuit of the whole light-emitting device 10 caused by the second pad 20 being contacted with the second electrode layer 14

Figure 15:
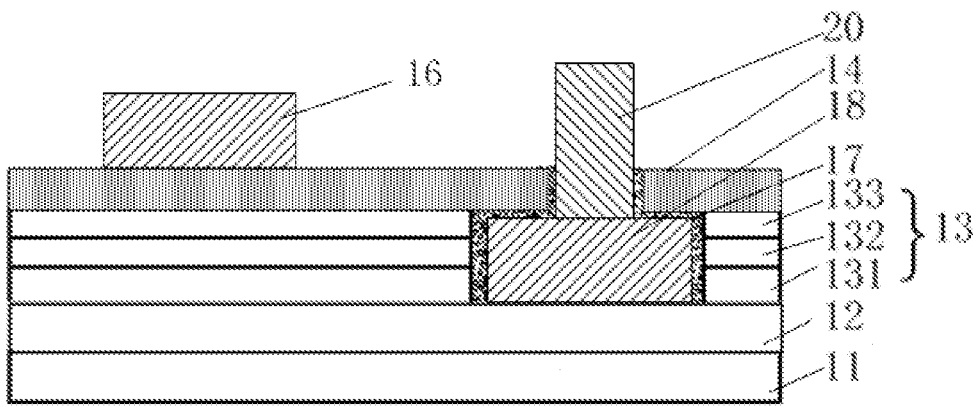

In FIG. 15, a first electrode 16 is formed on the first electrode layer 14 by a plating process.

Figure 16:
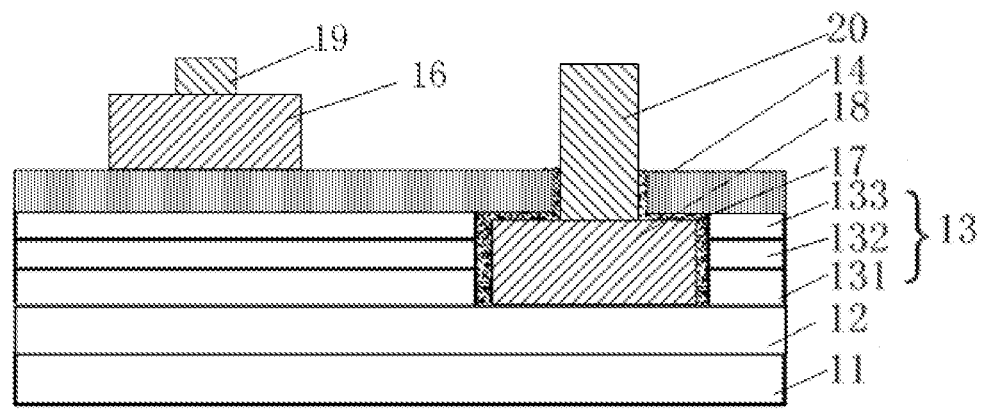

In FIG. 16, a first pad 19 is formed on the first electrode 16 by a plating process.

Figure 17:
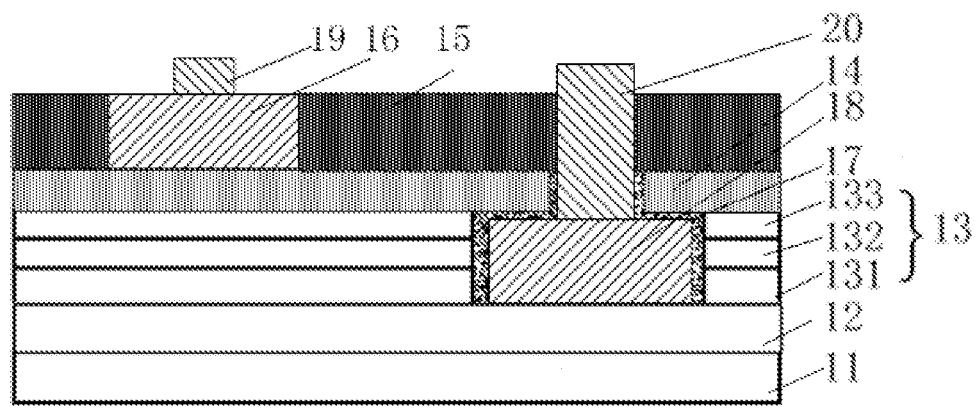

In FIG. 17, the portion of the upper surface of the first electrode layer 14 being not contacted with (covered by) other structures is formed with a reflective layer 15, and a thickness of the reflective layer 15 is not limited herein.

It is noted that, in the above embodiments, junctions between layers can be set to be uneven shaped so as to enhance the tightness of connection; the thickness of each layer herein is not limited and can be set according to actual requirement. In addition, the above process flow only is an exemplary embodiment, apparently, based on the light-emitting device 10 of the invention, other process also can achieve the effect but will not be listed herein.

Figure 18:
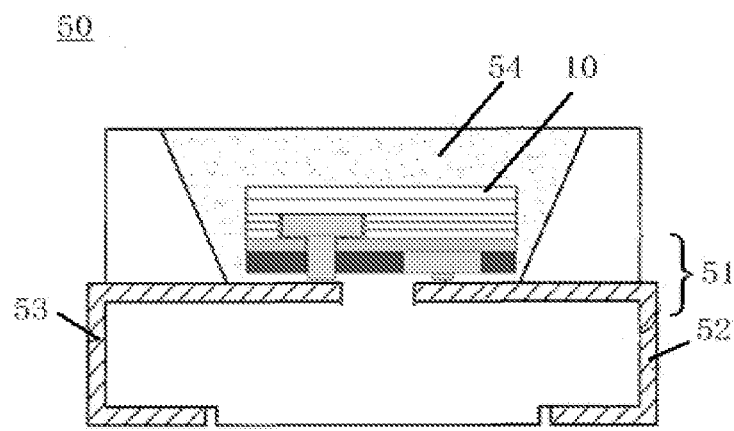
FIG. 18 is a structural schematic view of a light-emitting device package according to an embodiment of the invention.

FIG. 18 is a side sectional view of a light-emitting device package 50 according to an embodiment of the invention, and it will be described below in conjunction with the structure of the light-emitting device.

Referring to FIG. 18, the light-emitting device package 50 includes a main body 51, a first and a second lead electrodes 52, 53 disposed on the main body 51, any one of the light-emitting devices 10 in the embodiments corresponding to FIGS. 1 through 6 is disposed in the main body 51 and electrically connected with the first and second lead electrodes 52, 53, and a molding element 54 surrounding the light-emitting device 10.

The main body 51 may include silicon, a synthetic resin such as PPA, or a metal material. An inclined surface may be formed around the light-emitting device 10. The main body 51 may have an upper opened cavity structure. The light-emitting device 10 may be provided in the cavity structure.

The first and second lead electrodes 52, 53 are insulated/separated from each other and for powering the light-emitting device 10. The first and second lead electrodes 52, 53 can dissipate heat of the light-emitting device 10 to outside.

The light-emitting device 10 may be secured on the main body 51, or mounted on the first lead electrode 52 and the second lead electrode 53.

The light-emitting device 10 may be supported on the leads (52, 53) by the first pad and the second pad, so as to reduce the contact area between the light-emitting device 10 and the main body 51 and therefore is beneficial to dissipate the heat of wires/leads.

The molding element 54 can protect the light-emitting device 10 by surrounding the light-emitting device 10. The molding element 54 may include a phosphor for changing a wavelength of light emitted from the light-emitting device 10. Moreover, a lens may be formed on the molding element.

By packaging the light-emitting device 10 associated with any one embodiment on a semiconductor substrate including resin or silicon, an insulating substrate or a ceramic substrate, the semiconductor light-emitting device 10 can be used as a light source which can be used for indicators, lighting fixtures, display devices and so on. Various embodiments may be selectively adapted to another embodiment.

In summary, by adopting the light-emitting device 10 of the invention, the first electrode 16 and the second electrode 18 are protruding out of the reverse surface of the light output surface of the light-emitting device 10, there is no need of leading wires from the light output surface of the light-emitting device 10, which can avoid the wires/leads connected with the first electrode 16 and the second electrode 18 to absorb and block light, the light extraction efficiency is improved as a result. Moreover, the light-emitting device 10 associated with the embodiments of the invention disposes the transmissive layer 11 on the first electrode layer 12, so that the emitted light would be more uniform with the aid of the transmissive layer 11. In addition, the upper surface of the transmissive layer 11 can be disposed with concave-convex structures, the surface area of the transmissive layer 11 is increased and thus the light extraction efficiency can be improved. By disposing the first electrode layer between the transmissive layer 11 and the second conductive type semiconductor layer 131, the current flowing through the second electrode 18 can uniformly spread into the second conductive type semiconductor layer 131 via the first electrode layer 12; by disposing the second electrode layer 14 between the first electrode 16 and the first conductive type semiconductor layer 133, the current flowing through the first electrode 16 can uniformly spread into the first conductive type semiconductor layer 133 via the second electrode layer 14; as a result, the light-emitting performance of the light-emitting structure 13 is improved. By disposing the reflective layer 15 on the surface of the second electrode layer 14 away from the first conductive type semiconductor layer 133, light diverged by the first conductive type semiconductor layer 133 of the light-emitting structure 13 can be reflected toward the light output surface of the light-emitting structure 13, and the light extraction efficiency is improved.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A light-emitting device comprising:
   a light-emitting structure, wherein the light-emitting structure comprises a first conductive type semiconductor layer, an active layer and a second conductive type semiconductor layer sequentially stacked in that order, the second conductive type semiconductor layer acts as a light output surface of the light-emitting structure;
   a first electrode, wherein the first electrode is disposed on a surface of the first conductive type semiconductor layer away from the active layer and is electrically connected with the first conductive type semiconductor layer;
   a first electrode layer, wherein the first electrode layer is disposed on a surface of the second conductive type semiconductor layer away from the active layer and is electrically connected with the second conductive type semiconductor layer;
   a second electrode, wherein the second electrode penetrates through the light-emitting structure and is electrically connected with the first electrode layer;
   an insulating layer, wherein the insulating layer is disposed between the light-emitting structure and the second electrode;
   wherein the light-emitting device further comprises a second electrode layer, the second electrode layer is disposed on the surface of the first conductive type semiconductor layer away from the active layer, the first electrode and the first conductive type semiconductor layer are electrically connected with each other via the second electrode layer, the second electrode penetrates through the second electrode layer; the insulating layer further is disposed between the second electrode and the second electrode layer.

2. The light-emitting device as claimed in claim 1, wherein the light-emitting device further comprises a transmissive layer; the transmissive layer is disposed on a surface of the first electrode layer away from the second conductive type semiconductor layer, the transmissive layer is for increasing light extraction efficiency of the light-emitting structure.

3. The light-emitting device as claimed in claim 2, wherein a surface of the transmissive layer away from the first electrode is concave and convex shaped.

4. The light-emitting device as claimed in claim 1, wherein the light-emitting device further comprises a reflective layer; the reflective layer is disposed on a surface of the second electrode layer away from the first conductive type semiconductor layer, the first electrode and the second electrode both penetrate through the reflective layer.

5. The light-emitting device as claimed in claim 1, wherein the light-emitting device further comprises a first pad and a second pad; the first pad is disposed on a surface of the first electrode away from the first conductive type semiconductor layer and for electrically connecting with the first electrode, the second pad is disposed on a surface of the second electrode away from the first electrode layer and for electrically connecting with the second electrode.

6. The light-emitting device as claimed in claim 5, wherein the insulating layer further is disposed between the second pad and the second electrode layer.

7. The light-emitting device as claimed in claim 6, wherein the light-emitting device further comprises a reflective layer; the reflective layer is disposed on a surface of the second electrode layer away from the first conductive type semiconductor layer, the first electrode or the first pad penetrates through the reflective layer, the second electrode or the second pad penetrates through the reflective layer.

8. A light-emitting device package comprising a light-emitting device, the light-emitting device comprising:
   a light-emitting structure, wherein the light-emitting structure comprises a first conductive type semiconductor layer, an active layer and a second conductive type semiconductor layer sequentially stacked in that order, the second conductive type semiconductor layer acts as a light output surface of the light-emitting structure;
   a first electrode, wherein the first electrode is disposed on a surface of the first conductive type semiconductor layer away from the active layer and is electrically connected with the first conductive type semiconductor layer;
   a first electrode layer, wherein the first electrode layer is disposed on a surface of the second conductive type semiconductor layer away from the active layer and is electrically connected with the second conductive type semiconductor layer;
   a second electrode, wherein the second electrode penetrates through the light-emitting structure and is electrically connected with the first electrode layer;
   an insulating layer, wherein the insulating layer is disposed between the light-emitting structure and the second electrode;
   wherein the light-emitting device further comprises a second electrode layer; the second electrode layer is disposed on a surface of the first conductive type semiconductor layer away from the active layer, the first electrode and the first conductive type semiconductor layer are electrically connected with each other through the second electrode layer, the second electrode penetrates through the second electrode layer; the insulating layer further is disposed between the second electrode and the second electrode layer.

9. The light-emitting device package as claimed in claim 8, wherein the light-emitting device further comprises a transmissive layer; the transmissive layer is disposed on a surface of the first electrode layer away from the second conductive type semiconductor layer, the transmissive layer is for increasing light extraction efficiency of the light-emitting structure.

10. The light-emitting device package as claimed in claim 9, wherein a surface of the transmissive layer away from the first electrode is concave and convex shaped.

11. The light-emitting device package as claimed in claim 8, wherein the light-emitting device further comprises a reflective layer; the reflective layer is disposed on a surface of the second electrode layer away from the first conductive type semiconductor layer, the first electrode and the second electrode penetrate through the reflective layer.

12. The light-emitting device package as claimed in claim 8, wherein the light-emitting device further comprises a first pad and a second pad; the first pad is disposed on a surface of the first electrode away from the first conductive type semiconductor layer and for electrically connecting with the first electrode, the second pad is disposed on a surface of the second electrode away from the first electrode layer and for electrically connecting with the second electrode.

13. The light-emitting device package as claimed in claim 12, wherein the insulating layer further is disposed between the second pad and the second electrode layer.

14. The light-emitting device package as claimed in claim 13, wherein the light-emitting device further comprises a reflective layer; the reflective layer is disposed on a surface of the second electrode layer away from the first conductive type semiconductor layer, the first electrode or the first pad penetrates through the reflective layer, the second electrode or the second pad penetrates through the reflective layer.

\* \* \* \* \*